US006737360B2

United States Patent
Lee

(10) Patent No.: US 6,737,360 B2
(45) Date of Patent: *May 18, 2004

(54) CONTROLLED POTENTIAL ANODIC ETCHING PROCESS FOR THE SELECTIVE REMOVAL OF CONDUCTIVE THIN FILMS

(75) Inventor: Kevin J. Lee, Aloha, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/475,492

(22) Filed: Dec. 30, 1999

(65) Prior Publication Data

US 2002/0119671 A1 Aug. 29, 2002

(51) Int. Cl.[7] .............................................. H01L 21/302
(52) U.S. Cl. ....................................... 438/745; 438/754
(58) Field of Search ................................. 438/689, 745, 438/747, 748, 754

(56) References Cited

U.S. PATENT DOCUMENTS

| 4,294,667 A | * | 10/1981 | Yamamoto et al. ......... 204/1 T |
| 5,055,416 A | * | 10/1991 | Weber ........................... 437/4 |
| 5,324,399 A | * | 6/1994 | Ludwig et al. ........... 204/153.1 |
| 5,399,247 A | * | 3/1995 | Carey et al. ................. 204/131 |
| 5,650,062 A | * | 7/1997 | Ikeda et al. .................. 205/778 |
| 5,863,412 A | * | 1/1999 | Ichinose et al. ............. 205/652 |
| 6,051,116 A | * | 4/2000 | Ichinose et al. ............. 204/212 |
| 6,348,734 B1 | * | 2/2002 | Brown ......................... 257/751 |

\* cited by examiner

*Primary Examiner*—Kin-Chan Chen
(74) *Attorney, Agent, or Firm*—Blakely, Sokoloff, Taylor & Zafman LLP

(57) ABSTRACT

A process for selectively removing a conductive layer from a wafer that includes sub-micron sized noble metal interconnect features is disclosed. The wafer having sub-micron sized noble metal interconnect features and a conductive film to be removed is placed into an electrolyte solution. Also immersed in the electrolyte solution are a counter electrode, a reference electrode, and a working electrode. The wafer is coupled to the working electrode terminal on a potentiostat. The counter electrode is connected to the counter electrode terminal on a potentiostat, and the reference electrode is connected to a reference electrode terminal on the potentiostat. The potentiostat adjusts the electrical current flowing between the wafer and the counter electrode to maintain a constant voltage between the wafer and the reference electrode as the conductive layer is removed. The removal of the conductive layer is finished when the current that maintains the constant voltage between the wafer and the reference electrode drops to a residual level.

8 Claims, 5 Drawing Sheets

CONTROLLED POTENTIAL ANODIC ETCHING PROCESS FOR THE SELECTIVE REMOVAL OF CONDUCTIVE THIN FILMS

BACKGROUND OF THE INVENTION (1) Field of the Invention

The invention relates to the field of manufacturing of semiconductor wafers. More specifically, the invention relates to the formation of metal lines and vias as part of interconnect systems on semiconductor wafers.

(2) Background Information

Modern integrated circuits typically contain multiple layers of metal lines and vias which electrically connect the millions of passive and active devices such as transistors, capacitors and resistors in the integrated circuits. The multiple layers of metal lines and vias are collectively known as "interconnects" or the metallization of the integrated circuit. The characteristics and quality of the interconnects or metallization is a key component affecting the performance and reliability of the integrated circuit.

In contemporary semiconductor processing, aluminum metallization is most commonly used because aluminum is inexpensive and the manufacturing processes required to form aluminum metallization are relatively simple. However, as semiconductor device sizes are reduced below 0.25 um and the clock speeds increase above 500 MHz, aluminum is rapidly becoming undesirable as an interconnect material because of its relatively poor electromigration and conductivity properties. It has become highly desirable to fabricate interconnects from noble metals such as copper because noble metals are more conductive and more immune to electromigration.

One method of fabricating noble metal interconnects is known as the "Damascene" process. According to this process, a dielectric layer such as silicon oxide, which is deposited on the substrate, is etched to form via holes and oxide trenches. A noble metal such as copper is then deposited into the oxide trenches, via holes, and field areas by way of sputtering and electroplating. The unwanted noble metal in the field areas is then removed using chemical-mechanical polishing (CMP) methods. Unfortunately, certain aspects of the Damascene process are difficult to control, especially the CMP of the noble metal.

An alternate noble metal interconnect fabrication process has been developed to overcome some of the problems associated with the Damascene process. This process is documented in the patent application "A Single Step Electroplating Process for Interconnect Via Fill and Metal Line Patterning," Ser. No. 09/001,349 assigned to Intel Corporation of Santa Clara, Calif. Briefly, this process consists of introducing a barrier layer onto the surface of a substrate which has via holes. Over the barrier layer, a conductive layer is introduced followed by a photoresist layer. Noble metal via plugs and noble metal lines are then formed simultaneously using an electroplating process. The layer of photoresist is then removed, and the conductive layer and barrier layer are etched in areas where they are not covered by metal lines.

Perhaps the most challenging aspect in the above-referenced process is the requirement to etch the conductive layer, typically made of nickel, while leaving the noble metal lines, typically made of copper, and the barrier layer, typically made of titanium nitride, substantially unaffected. One method of etching the conductive layer while leaving the copper lines unaffected is to use a wet etchant. Many wet etchant formulations designed for etching nickel from copper substrates are documented in the literature and some are commercially available. However, these wet etchant formulations typically contain additives such as thiourea, ammonium thiocyanate, or sodium diethyldithiourea to inhibit the etchant from attacking the exposed copper. Unfortunately, these additives tend to cause formation of a dark residue (i.e., black smut) on the exposed copper interconnect surfaces, and this dark residue is difficult to remove after the etching process is complete. In addition, the rate at which the wet etchant removes the nickel layer tends to decrease quickly with use. Consequently, the etching process can be difficult to control. Accordingly, a need exists for an improved process of selectively etching the conductive film with minimal attack of the exposed noble metal interconnects and vias.

SUMMARY OF THE INVENTION

The invention provides in one embodiment thereof, a process to selectively remove a conductive film from a substrate. According to this process, a substrate having sub-micron interconnect features is placed in an electrolyte solution. The substrate is coupled to a working electrode terminal of a potentiostat. A voltage is maintained between the substrate and a reference electrode at a fixed value by varying a current between the substrate and a counter electrode. A path of the current is broken when the current has a second current value substantially lower than a first current value.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the invention.

One embodiment of the invention includes a process for selectively removing a conductive layer (hereinafter referred to as "film") from a substrate (such as a semiconductor wafer) that has sub-micron size noble metal interconnect features. According to this process a substrate with sub-micron sized noble metal interconnect features and a conductive layer to be removed is placed into an electrolyte solution along with a counter electrode and a reference electrode. The wafer is coupled to a working electrode terminal of a potentiostat. The counter electrode is connected to the counter electrode terminal of the potentiostat. The reference electrode is connected to the reference electrode terminal of the potentiostat. The potentiostat adjusts the electrical current flowing between the wafer and the counter electrode to maintain a constant voltage between the wafer and the reference electrode as the conductive layer is selectively removed (etched). The removal of the conductive layer is finished when the first current, applied to maintain the constant voltage between the wafer and the reference electrode, drops to a second current value (hereinafter referred to as "low residual current"). The low residual current asymptotically converges towards zero.

Figure 1:
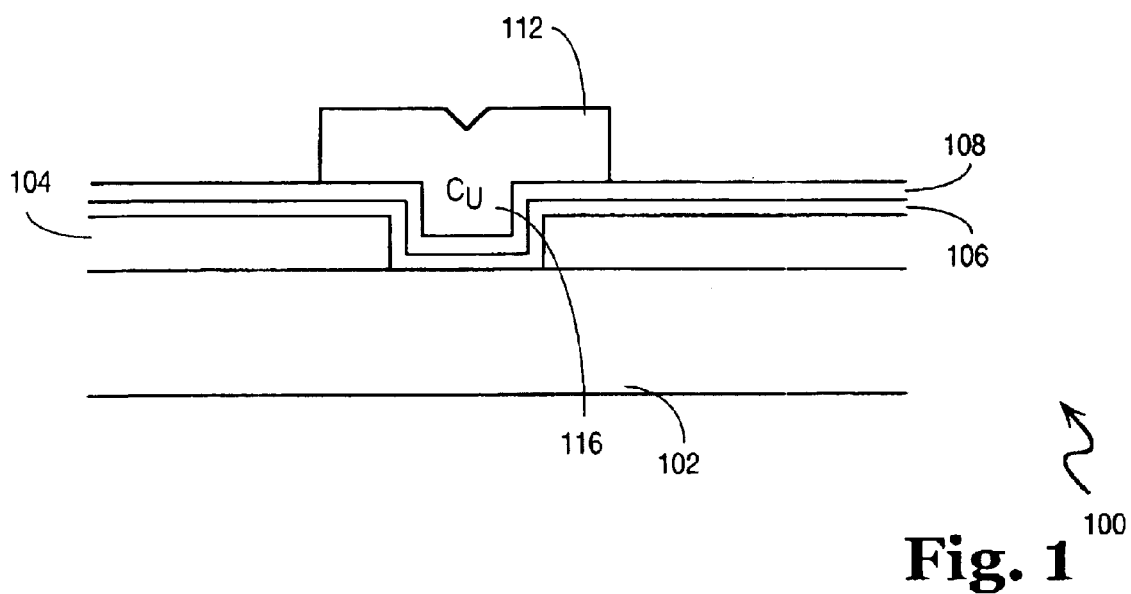
FIG. 1 illustrates a cross-sectional view through a portion of a wafer according to one embodiment of the present invention.

FIG. 1 illustrates a cross-sectional view through a portion of wafer 100 that may be subjected to the process for selectively removing a conductive layer. The portion of wafer 100 includes semiconductor substrate 102 onto which an oxide layer such as silicon dioxide ($SiO_2$) 104 is formed. Oxide layer 104 has a via hole formed therein. Furthermore, the portion of wafer 100 has barrier layer 106 typically made of titanium nitride deposited over oxide layer 104. Conductive layer 108, typically made of nickel, is formed over barrier layer 106. A noble metal via, such as copper via 116 is formed in the via plug. Copper via 116 is coupled to a portion of metal line 112. For information about wafer 100 with barrier layer 106, conductive layer 108, and via 116, see the patent application entitled "A Single Step Electroplating Process for Interconnect Via Fill and Metal Line Patterning", that has Ser. No. 09/001,349 and is assigned to Intel Corporation of Santa Clara, Calif.

Figure 2:
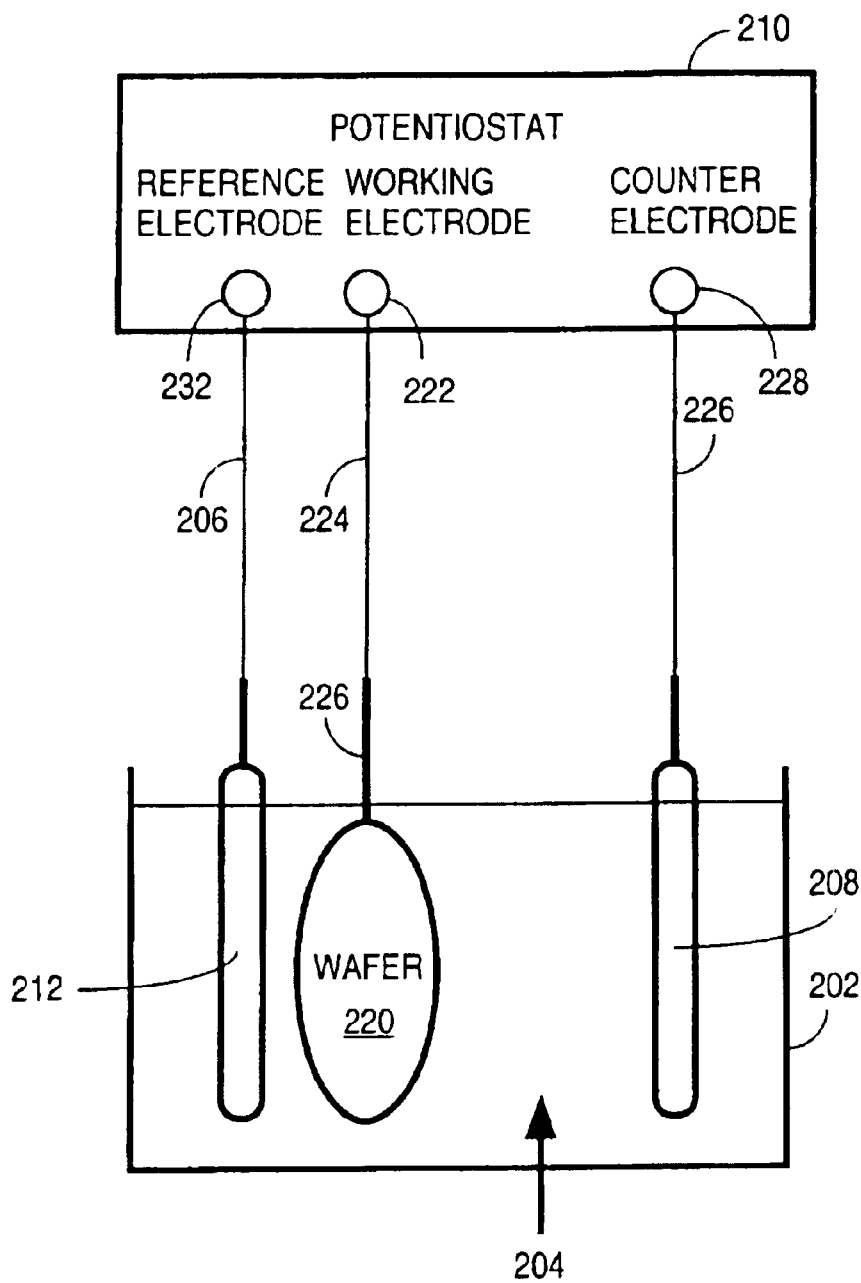
FIG. 2 illustrates an apparatus utilized in an embodiment of a process for selectively removing a conductive layer according to the present invention.

Conductive layer 108 may be selectively etched from barrier layer 106 while leaving noble metal vias 116 and metal lines 112 substantially unaffected by using an embodiment of a process according to the present invention. FIG. 2 illustrates apparatus 200 used in connection with the embodiment of the process of selectively removing a conductive layer. Apparatus 200 includes tank 202 that stores electrolyte solution 204. For one embodiment, the electrolyte solution 204 is a five percent hydrochloric acid (HCl) in water solution made by the Electroplating Engineers of Japan, Sakairi, K. (EEJA).

Wafer 220, to be processed by one embodiment of the process according to the invention, is immersed in electrolyte solution 204 and attached to working electrode terminal 222 of potentiostat 210. Wafer 220 is attached to working electrode terminal 222 by way of conductive cable 224. One way of attaching wafer 220 to conductive cable 224 is by using a mounting mechanism that may include clip 226. Clip 226 makes good electrical contact with the conductive layer to be selectively etched off wafer 220. Counter electrode 208 is immersed in electrolyte solution 204 by way of electrically conductive cable 230 that is coupled to counter electrode terminal 228 of potentiostat 210. Also immersed in electrolyte solution 204 is reference electrode 212 which is coupled to reference electrode terminal 232 of the potentiostat by way of electrically conductive cable 206.

During the controlled potential anodic etching process, potentiostat 210 monitors the voltage between wafer 220 and reference electrode 212, and forces current through wafer 220 to hold the voltage between wafer 220 and reference electrode 212 at a user-defined value that is a function of the physical properties of the conductive layer material and of the noble metal interconnect material. When the oxidation potential of the sub-micron size noble metal interconnect features differs significantly from the oxidation potentials of the conductive layer and barrier layer, it is possible to select a voltage between wafer 220 and reference electrode 212 that leads to the preferential removal of the conductive layer with respect to the sub-micron size noble metal interconnect features present on the wafer's surface. In one embodiment of the invention, the barrier layer includes titanium nitride, the conductive layer includes nickel, the sub-micron size noble metal interconnect features include copper, and the voltage between the wafer and a Ag/AgCl reference electrode is in the range of $-0.4$ to $+0.2$ volts.

Figure 3:
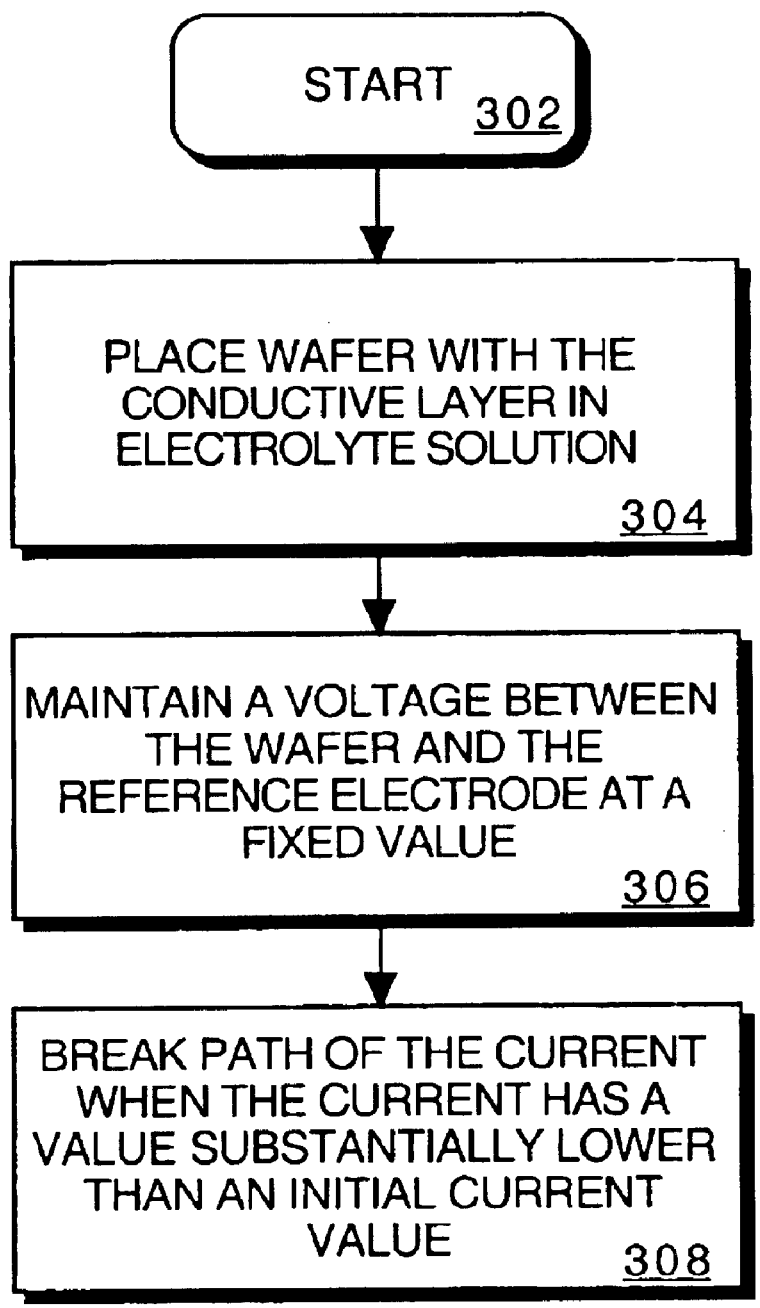
FIG. 3 illustrates a flow chart diagram in connection with a process of selectively removing a conductive layer from a wafer.

FIG. 3 is a flow chart diagram in connection with a process of selectively removing a conductive layer from a wafer that has sub-micron size noble metal interconnect features. The process starts at block 302 from where it flows to block 304. At block 304, a wafer with the conductive layer is placed in an electrolyte solution. The wafer is coupled to a working electrode terminal of a potentiostat. The process then flows to block 306 where a voltage between the wafer and the reference electrode is maintained at a fixed value by varying a current between the wafer and a counter-electrode. Next, the process flows to block 308 where a path of the current is broken when the current has a value substantially lower than a second current value also called a "residual current value."

Figure 4:
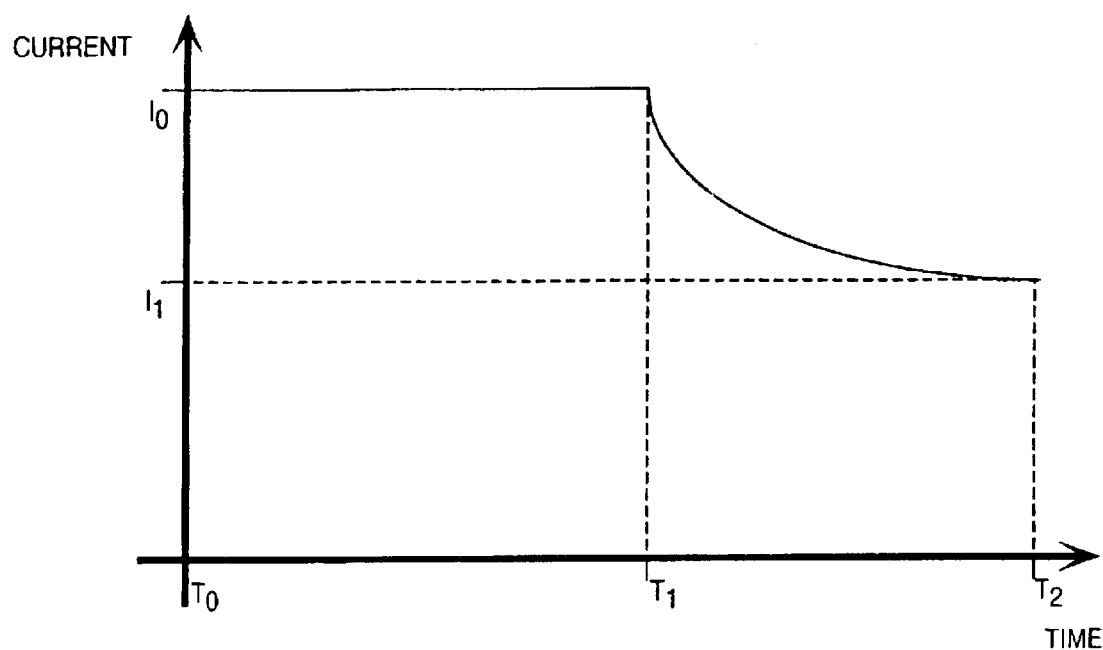
FIG. 4 illustrates a current-time diagram in connection with the embodiment of a process according to the present invention.

FIG. 4 illustrates a current-versus-time diagram in connection with the process according to one embodiment of the present invention explained earlier in this section. From time $T_0$ to time $T_1$, the current I is constant at $I_0$ because the surface area of the conductive layer exposed to the electrolyte solution is constant. At time $T_1$, the etching process has proceeded to the point where the nickel begins to be etched away down to the barrier layer. At this point, the nickel surface on the wafer, which is still available to be etched, decreases. Consequently, the current required to hold the voltage between the wafer and the reference electrode at a constant level decreases. By time $T_2$, the nickel has been completely removed from the wafer outside the area occupied by an interconnect line. When the measured current stabilizes at this current level $I_1$, the anodic etching process is complete. The applied voltage is then turned off, when the measured current stabilizes at a second current level, either by manually turning off the potentiostat or by using a computerized process controller to automatically turn off the potentiostat when the current drops below a user-defined value.

The barrier layer is at least mildly conductive for the controlled potential anodic etching process discussed above to work properly. During the etching process, there comes a point in time when the nickel layer is etched all the way down to the barrier layer in some places on the wafer but not in other areas of the wafer. To remove the nickel which is still remaining on the wafer surface, the current needs to flow to all areas on the wafer where there is remaining nickel. Therefore, the barrier layer is at least mildly conductive.

Figure 5:
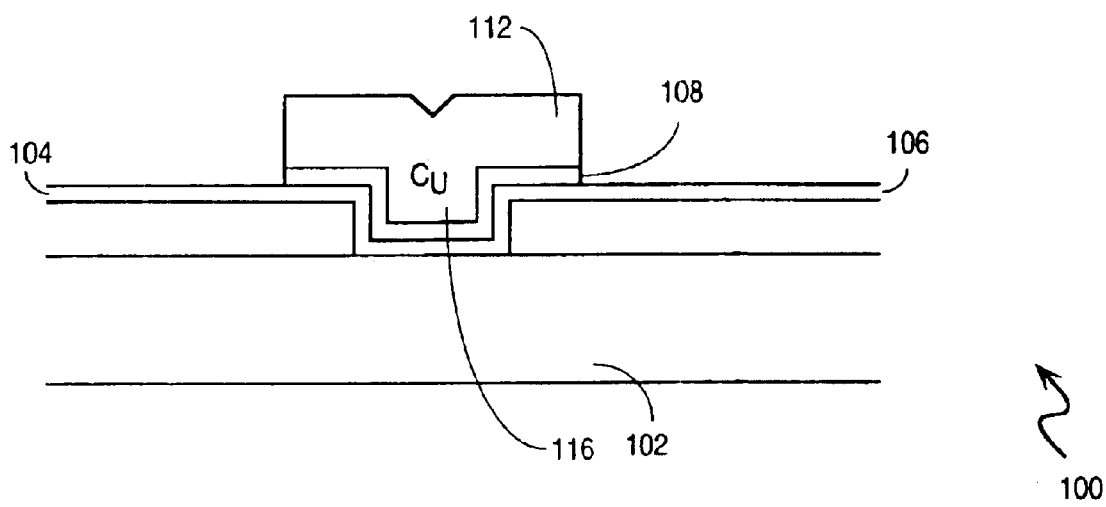
FIG. 5 illustrates a cross-sectional view through the wafer portion of FIG. 1 after the conductive layer was removed.

FIG. 5 illustrates a cross-sectional view through the portion of wafer portion of FIG. 1 after the process discussed above has been performed. The portion of conductive layer of 108, outside the area occupied by interconnect line 112, is shown removed from barrier layer 106.

In the previous detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A process to selectively remove a conductive layer from a substrate, the process comprising:

depositing a conductive layer, a first noble metal layer and a barrier layer on a substrate;

placing the substrate in an HCL solution after said depositing, the substrate having sub-micron interconnect features, said sub-micron interconnect features including the first noble metal layer coupled to the conductive layer, the conductive layer of the substrate coupled to a working electrode terminal of a potentiostat;

maintaining a voltage between the substrate and a reference electrode at a fixed value by varying a first current between the substrate and a counter electrode while the substrate remains in the volatile electrolyte solution and the amount of conductive layer is reduced; and breaking a path of the current when the current reaches a second current value substantially lower than a first current value, wherein the first noble metal layer remains deposited on the substrate as the conductive layer is selectively removed from the barrier layer of the substrate.

2. The process of claim 1, wherein maintaining a voltage includes measuring a potential difference between the substrate and the reference electrode.

3. The process of claim 1, wherein the conductive layer of the substrate is etched on a conductive barrier layer surface of the substrate.

4. The process of claim 3, wherein the barrier layer includes titanium nitride.

5. The process of claim 1, wherein the conductive layer includes nickel.

6. The process of claim 1, wherein the sub-micron interconnect features includes a noble metal.

7. The process of claim 6, wherein the noble metal includes copper.

8. A process to selectively remove a conductive layer from a substrate, the process comprising:

depositing a conductive layer, a first noble metal layer and a barrier layer on a substrate;

placing said substrate in an HCl solution after said depositing, the substrate having sub-micron size metal interconnect features, said sub-micron size metal interconnect features including the first noble metal layer coupled to the conductive layer, the conductive layer of the substrate coupled to a working electrode terminal of a potentiostat;

maintaining a voltage between the substrate and a reference electrode at a fixed value, as the conductive layer is removed, by varying a current between said substrate and a counter electrode while the substrate remains in the HCl electrolyte solution and the amount of conductive layer is reduced; and breaking a path of said current when a second current value reached is substantially lower than a first current value, wherein the first noble metal layer remains substantially unaffected on the substrate as the conductive layer is selectively removed from the barrier layer of the substrate.

* * * * *

UNITED STATES PATENT AND TRADEMARK OFFICE
CERTIFICATE OF CORRECTION

PATENT NO. : 6,737,360 B2
DATED : May 18, 2004
INVENTOR(S) : Lee

It is certified that error appears in the above-identified patent and that said Letters Patent is hereby corrected as shown below:

Column 4,
Line 41, insert -- residual -- before the word "current".

Column 5,
Line 9, delete "HCL" and insert -- HCl electrolyte --.
Line 19, delete "volatile" and insert -- HCl --.
Line 24, delete "deposited" and insert -- substantially unaffected --.

Column 6,
Line 13, insert -- electrolyte -- after the word "HCl".

Signed and Sealed this

Seventeenth Day of August, 2004

JON W. DUDAS
*Acting Director of the United States Patent and Trademark Office*